(12) United States Patent
Feltin et al.

(10) Patent No.: US 7,282,381 B2
(45) Date of Patent: Oct. 16, 2007

(54) METHOD OF PRODUCING SELF SUPPORTING SUBSTRATES COMPRISING III-NITRIDES BY MEANS OF HETEROEPITAXY ON A SACRIFICIAL LAYER

(75) Inventors: Eric Pascal Feltin, La Gaude (FR); Zahia Bougrioua, Nice (FR); Gilles Nataf, Golfe Juan (FR)

(73) Assignee: Centre National de la Recherche Scientifique (CNRS) (FR)

( * ) Notice: Subject to any disclaimer, the term of this patent is extended or adjusted under 35 U.S.C. 154(b) by 0 days.

(21) Appl. No.: 10/573,463

(22) PCT Filed: Sep. 24, 2004

(86) PCT No.: PCT/FR2004/002416

§ 371 (c)(1),
(2), (4) Date: Dec. 1, 2006

(87) PCT Pub. No.: WO2005/031045

PCT Pub. Date: Apr. 7, 2005

(65) Prior Publication Data

US 2007/0072396 A1    Mar. 29, 2007

(30) Foreign Application Priority Data

Sep. 26, 2003   (FR) ................... 03 11296

(51) Int. Cl.
*H01L 21/00* (2006.01)
(52) U.S. Cl. .............. 438/46; 438/458; 117/922; 257/E21.12; 257/E21.118
(58) Field of Classification Search ............. 438/46, 438/458, 619; 257/E21.12, E21.118
See application file for complete search history.

(56) References Cited

U.S. PATENT DOCUMENTS 5,919,305 A    7/1999   Solomon (Continued)

FOREIGN PATENT DOCUMENTS

EP   1 041 610 A1   10/2002

(Continued)

OTHER PUBLICATIONS

Frayssinet, Beaumont, Faurie, Gibart, Makkai, Lefebvre and Valvin, "Micro Epitaxial Lateral Overgrowth of GaN/sapphire by Metal Organic Vapour Phase Epitaxy", MRS Internet J. Nitride Semicond. Res. 7, 8 (2002), pp. 1-7.

(Continued)

*Primary Examiner*—W. David Coleman
*Assistant Examiner*—Ankush Singal
(74) *Attorney, Agent, or Firm*—Lerner, David, Littenberg, Krumholz & Mentlik, LLP

(57) ABSTRACT

The invention relates to a method for the production of self-supporting substrates comprising element III nitrides. More specifically, the invention relates to a method of producing a self-supporting substrate comprising a III-nitride, in particular, gallium nitride (GaN), which is obtained by means of epitaxy using a starting substrate. The invention is characterised in that it consists in depositing a single-crystal silicon-based intermediary layer by way of a sacrificial layer which is intended to be spontaneously vaporised during the III-nitride epitaxy step. The inventive method can be used, for example, to produce a flat, self-supporting III-nitride layer having a diameter greater than 2".

27 Claims, 5 Drawing Sheets

U.S. PATENT DOCUMENTS

Figure 1:
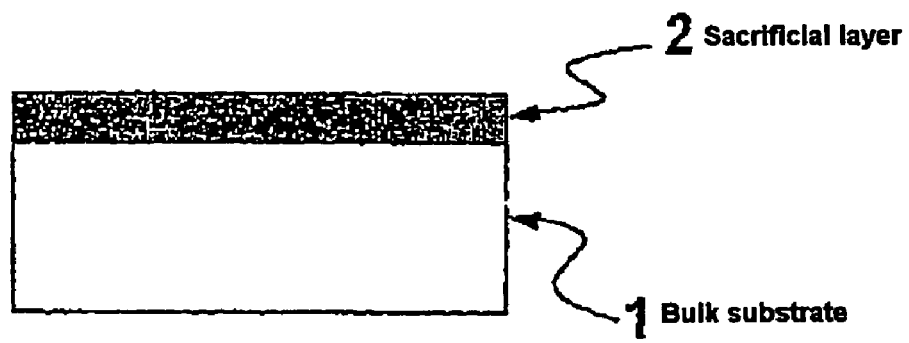

| | | |
|---|---|---|
| 6,071,795 A | 6/2000 | Cheung et al. |
| 6,146,457 A | 11/2000 | Solomon |
| 6,559,075 B1 | 5/2003 | Kelly et al. |
| 6,924,159 B2 * | 8/2005 | Usui et al. ............... 438/22 |
| 2001/0022154 A1 | 9/2001 | Cho et al. |
| 2002/0182889 A1 | 12/2002 | Solomon et al. |
| 2003/0024472 A1 | 2/2003 | Maruska et al. |

FOREIGN PATENT DOCUMENTS

| | | |
|---|---|---|
| EP | 1 245 702 A | 10/2002 |
| EP | 1 246 233 A2 | 10/2002 |
| WO | WO-96/41906 A | 12/1996 |
| WO | WO-03/062507 A | 7/2003 |

OTHER PUBLICATIONS

Beaumont B., Vennegues P., Gibart P., "Epitaxial Overgrowth of GaN", Phys. Stat. sol. (b) 227, No. 1, pp. 1-43, 2001.

Lahreche, Vennegues, Beaumont and Gibart, "Growth of high-quality GaN by low pressure metal-orgainc vapor phase epitaxy (LP-MOVPE) from 3D islands and lateral overgrowth". Journal of Crystal Growth 205, 245 (1999).

Mathis et al., "Modeling of threading dislocation reduction in growing GaN layers", Journal of Crystal Growth, 231, pp. 371-390, (2001).

* cited by examiner

METHOD OF PRODUCING SELF SUPPORTING SUBSTRATES COMPRISING III-NITRIDES BY MEANS OF HETEROEPITAXY ON A SACRIFICIAL LAYER

The present invention relates to the elaboration of freestanding substrates of group-III nitrides, in particular of gallium nitride.

Although group-III nitrides have been used for more than a decade in the manufacture of optoelectronic devices, currently no commercial source exists for freestanding group-III-nitride (GaN, AlN, InN, etc.) substrates.

A freestanding substrate is a substrate of such thickness that it does not require a support to be used in the manufacture of optoelectronic and electronic components.

Heteroepitaxy remains the sole solution for the manufacture of group-III-nitride-based components. The substrates used industrially for the epitaxy of gallium nitride are sapphire ($Al_2O_3$) and silicon carbide (SiC). Differences in the lattice parameters and the thermal expansion coefficients between these substrates and the group-III nitride have as a consequence the formation in the epitaxial layers of many defects which degrade the performance of the electronic components produced using these materials. When the substrate is sapphire, techniques have been developed that consist of intercalating a nucleation layer, for example made of GaN or AlN deposited under distinct growth conditions, between the substrate and the epitaxial layer of the group-III nitride. This surface treatment makes it possible to limit the density of defects.

Various techniques that aim at providing solutions for the separation of the initial substrate from the epitaxial layer of the group-III nitride in order to obtain freestanding substrates are currently under development. Such freestanding substrates of GaN typically have a thickness of 300 μm.

Among these techniques, in addition to polishing, chemical separation can be cited in particular. The document EP 1 041 610 thus reveals such a technique, adapted to specific Si, $NdGaO_3$ and GaAs substrates. Similarly, the document US2003/0014472 describes a technique that uses chemical etching in the specific case of a $LiAlO_2$ substrate. However, this technique is not applicable for a sapphire substrate, which is chemically inert. Moreover, the use of substrates that can be etched chemically (silicon, GaAs, spinel, etc.) are not always compatible with the techniques of epitaxy traditionally used for the deposition of thick layers of group III nitrides. For example, the use of silicon substrates results in the appearance of thermal stress in the gallium nitride layers. This thermal stress is responsible for the formation of cracks. Moreover, silicon is not thermally stable at normal epitaxial temperatures.

Methods have also been described that use an intermediate chemical etching step which is intended to eliminate the intercalary or sacrificial layers. Thus can be cited the document U.S. Pat. No. 5,919,305, where the deposited sacrificial layer, which has been etched partially or completely, can be silicon oxide, silicon nitride, silicon carbide or silicon, and where the primary objective is to deal with the problem of thermal expansion mismatch, which is responsible for the high density of defects, directly in the epitaxial reactor. Another technique has been developed and described in document EP 1 245 702, in which the method aims at providing freestanding gallium nitride substrates by depositing between the substrate and the epitaxial layer of gallium nitride a layer of metal intended to be eliminated by chemical etching. Among the metals adapted to this method, aluminum, gold, silver, copper, platinum, iron, nickel, titanium, zirconium, hafnium and their alloys are cited.

Ablation by electromagnetic radiation is another type of technique currently under development within the scope of research on the manufacture of gallium nitride substrates. For example, laser lift-off (LLO), which is described in particular in the U.S. Pat. No. 6,559,075, is based on the use of a pulsed UV laser emission which passes through the sapphire, but which is absorbed by the layer of GaN, thus causing a local thermal decomposition of GaN near the interface. Other documents that use this technique can also be cited, including the documents US2002/0182889 and U.S. Pat. No. 6,071,795.

Lastly, the document WO03/062507 relates to a method for preparing a freestanding substrate made of a semiconductor material by a technique of adhering (by "molecular" adhesion) a nucleation layer to a substrate, in advance of a step of epitaxy of a single-crystal layer of the aforesaid semiconductor material. This nucleation layer plays the role of an interface that is spontaneously detachable under the effect of the reduction in post-epitaxial temperature which induces mechanical constraints on this interface.

In view of the above, it emerges that the solutions proposed are not simple in design. Indeed, these techniques do not avoid, in particular, damage to the group-III-nitride layer grown epitaxially on the substrate. Thus they often present disadvantages related to both implementation and production costs. Lastly, quite often once the freestanding layer is separated from the substrate, it presents significant curvature. As a result, the freestanding substrates arising from the methods mentioned above are not sufficiently flat to ensure the uniformity of the methods which can be carried out subsequently on these layers (epitaxy and/or the production of electronic components with, for example, lithography steps).

Thus, there is a real need for the availability of techniques for the manufacture of flat group-III-nitride substrates on wide surfaces. The objective remains, in particular, the homoepitaxy of gallium nitride leading to a material containing notably fewer defects of density.

The aim of the invention is to propose a method for producing a freestanding group-III-nitride substrate that is simple, fast and inexpensive and that provides a good-quality, planar group-III-nitride film on a wide surface.

Thus, the object of the invention is a method for producing freestanding substrates of group-III nitrides, in particular of GaN, from a starting substrate, by the deposition of a group III nitride by epitaxy, wherein it involves the use, on the aforementioned substrate, of a silicon-based intermediate layer as a sacrificial layer intended to be vaporized spontaneously during the later step of epitaxy of the group-III nitride.

The method according to the invention is particularly adapted to gallium nitride as the group-III nitride. It is also possible to produce substrates of AlN, $Al_xGa_{1-x}N$, $In_xGa_{1-x}N$ and more generally of $Al_xGa_yIn_{1-x-y}N$ (where $0 \leq x+y \leq 1$) according to the method of the invention.

The bulk starting substrate can be any material of which the chemical and physical properties are compatible with the epitaxy of group-III nitrides, and which allows the deposition of a single-crystal group-III-nitride layer. In other words, the substrate on which the sacrificial layer is deposited should, preferably, be stable. (does not decompose too rapidly) under the standard growth conditions used for the epitaxy of group-III nitrides. In particular, sapphire ($Al_2O_3$) or silicon carbide (SiC) can be cited as the starting substrate. The high thermal and chemical stabilities of sapphire, as well as its physical parameters (lattice parameters and thermal expansion coefficient), being significant advantages for the epitaxy of gallium nitride, sapphire is used preferentially as the initial substrate.

The starting substrate itself can be composed of various materials.

Still other thermally and chemically stable substrates can be used for the implementation of the method according to the invention, among which it is possible to cite in a non-exhaustive manner, $MgAl_2O_4$, AlN, GaN, quartz or a combination thereof.

The silicon-based intermediate, or sacrificial, layer is advantageously doped or undoped silicon. By "silicon-based" layer is meant any layer consisting predominantly of silicon. Other silicon-based semiconductors presenting adequate evaporation can also be used for this purpose. Silicon presenting impurities such as aluminum, indium, gallium, phosphorus or boron can be mentioned. $Si_{1-x}Ge_x$. with, by preference, a molar concentration of germanium less than x=10% can also be cited.

The thickness of the silicon-based sacrificial layer can lie between 100 nm and 10 µm.

The spontaneous vaporization of the intermediate, sacrificial layer during the group-III-nitride epitaxy step presents the major advantage of not requiring an additional procedural step specifically dedicated to the separation of the substrate and the group-III-nitride epitaxial layer. In other words, the separation is carried out completely or in a large part in situ, in the reactor intended for the epitaxial growth of the group-III nitride. In addition, as is explained below, another advantage relating to the method according to the present invention is the reduction of the stresses that cause dislocations, but also the reduction of the curvature of the group-III-nitride substrate thus obtained, due to the presence of the silicon-based intermediate layer which is compliant and ductile.

The group-III nitride that is deposited can be doped or undoped. As doping materials, magnesium, zinc, beryllium, calcium, carbon, boron, chromium, silicon and iron can be cited in particular.

According to a preferred embodiment of the invention, a single-crystal silicon layer oriented in the <111> direction deposited on the substrate will be chosen. Other orientations of silicon can however be implemented within the scope of the present invention. Thus the single-crystal silicon layer can also be oriented in the <110> and <100> directions. The growth conditions favorable to this type of deposition are generally carried out by vapor phase epitaxy (VPE). The manufacturing variations of such a deposition, such as the bonding of the silicon layer, and not its epitaxy, can also be used. For example, a description of bonding techniques can be found in the article "Semiconductor wafer bonding," Sciences and Technology, Q. Y. Tong, U. Gosële, Wiley Interscience Publications. This remark also makes provision for obtaining Si layers oriented in the <110> or <100> direction. The thickness of the sacrificial layer advantageously lies between 100 nm and 10 µm to allow an optimal epitaxy of the final group-III-nitride layer.

According to one variant of the invention, the silicon-based intermediate layer can be continuous or discontinuous according to a specific geometry (i.e., in an ordered way) or discontinuous without a specific organization (i.e., discontinuous disordered). In the case where the sacrificial layer is not continuous, the deposition of the group-III nitride on the substrate/sacrificial layer can be carried out on the sacrificial layer, or on areas of the bulk substrate not covered by the sacrificial layer, or on the entirety of the uncovered surface of the substrate and the sacrificial layer.

The use of a high-quality silicon-based crystalline layer is preferable for the growth of high-quality group-III nitrides.

The silicon-based sacrificial layer deposited on sapphire or on any other compatible substrate, as previously cited, is usable as a substrate for the epitaxy of group-III nitrides. A nucleation layer deposition step can be carried out before proceeding to the step of the epitaxy of the thick layer of the group-III nitride. The nature of this nucleation layer is selected such that it:

plays the part of a momentary layer of protection for the sacrificial layer (the normal growth conditions used for nitrides are likely to be corrosive for this layer; this is, for example, notorious in the case where the sacrificial layer is silicon), serves as a single-crystal group-III-nitride germination site: the lattice parameter of the nucleation layer must be compatible with the subsequent deposition of the group-III-nitride layer which will constitute the future freestanding substrate.

In other words, a nucleation layer of which the lattice parameter is close to that of the group-III nitride is used by preference so as to ensure the subsequent deposition of the single-crystal group-III nitride and to minimize the formation of dislocations. Thus, as the nucleation layer, it is possible to choose among the group comprised of AlN, SiC, low-temperature GaN, AlGaN, $Al_xGa_yIn_{1-x-y}N$ (where $0 \leq x+y \leq 1$), $Al_2O_3$, AlAs, GaAs or a combination of these various layers.

The growth of the nucleation layer is preferably carried out by metal-organic vapor-phase epitaxy (MOVPE) at a growth rate ranging between 0.01 and 3 µm/h. The epitaxial temperature is advantageously lower than 1200° C. as not to damage the silicon layer during this first step. The technique known as molecular beam epitaxy (MBE) can be also used.

According to a preferred embodiment of the invention, the deposition of the thick layer of the group-III nitride is carried out in two steps: a slow initial step, just after the nucleation layer, is carried out so as to condition an optimal crystallinity and a second step of fast deposition which will allow the thickening of the material leading to the future freestanding group-III-nitride substrate.

The initial layer is deposited advantageously by MOVPE, at a speed that can, in a preferred way, lie in the range between 0.1 and 5 µm/h. The MBE technique can be also used.

The thicknesses of the nucleation layer and the possible initial group-III-nitride layer can lie between 0.01 and 0.5 µm, and 0.1 and 10 µm, respectively.

The group-III-nitride layer grown epitaxially in the second step on the initial group-III-nitride layer is carried out by vapor phase epitaxy (VPE) up to the point at which a sufficient final thickness is obtained so that this layer can be separated from the sapphire substrate without breaking. In practice, this thickening step is carried out at high speed (generally between 10 and 200 µm/h) and, to be accomplished at low cost, the technique known as hydride vapor-phase epitaxy (HVPE) will be used very advantageously.

Typically, in the case of the elaboration of freestanding GaN substrates, the epitaxy is continued up to the point at which the group-III-nitride layer reaches at least 50 µm, the thickness traditionally considered to be sufficient so that the freestanding substrate is "manipulable." Within the scope of the present invention, the freestanding GaN substrates typically have a thickness that varies from 300 µm to 1 mm in the case of 2"-diameter freestanding substrates. The minimal thickness is in fact that for which the substrate is sufficiently solid to be manipulated under normal conditions of use.

During the growth of the group-III-nitride layer, the growth conditions (temperature, total pressure in the reactor, atmosphere, growth rate, etc.) must allow a progressive vaporization of the silicon-based intermediate layer deposited on the substrate so that ultimately the layer is completely or predominantly released or, so to speak, is debonded from the initial substrate. Thus, the vaporization of the silicon-based semiconductor must be sufficiently slow as not to disturb the progress of the thickening growth of the group-III-nitride layer before its termination. For this reason, the required thickness of the intermediate layer between the substrate and the group-III-nitride layer depends on the growth conditions used for the thickening of the group-III-nitride layer. It should be noted that the vaporization of a silicon-based intermediate layer can begin during the initial low-speed group-III-nitride deposition step, that is to say, during the MOVPE or MBE step, and can continue during the HVPE thickening step. This vaporization is likely to be as fast as the temperature and/or pressure in the reactors are high.

The growth parameters the most adapted to the growth, as well as to the separation, of the thick layer of the group-III nitride, taken separately or advantageously in combination, are as follows:

The pressure lies between $10^2$ and $10^5$ Pa,

The temperature lies between 800° C. and 1200° C.,

The growth rate lies between 10 and 200 μm/h,

As previously cited, the method presents two advantages. The first advantage is that the vaporization phenomenon occurs identically at each point on wide surfaces. The second advantage is that the material obtained is considerably unstressed due to the progressive debonding of the substrate as the silicon-based intermediate layer vaporizes during the high-temperature thickening, which leads to obtaining a final quasi-planar group-III-nitride layer of minimal curvature.

More particularly, the invention relates to a method for manufacturing a freestanding single-crystal group-III-nitride substrate comprising the following successive steps:

(i) the deposition or bonding of a silicon-based sacrificial layer on a substrate, (ii) the deposition of a nucleation layer, (iii) the deposition by epitaxy of a thick layer of the group-III nitride on the bilayer (silicon-based intermediate layer/nucleation layer), under operating conditions compatible with a spontaneous vaporization of the silicon-based sacrificial layer.

Figure 2A:
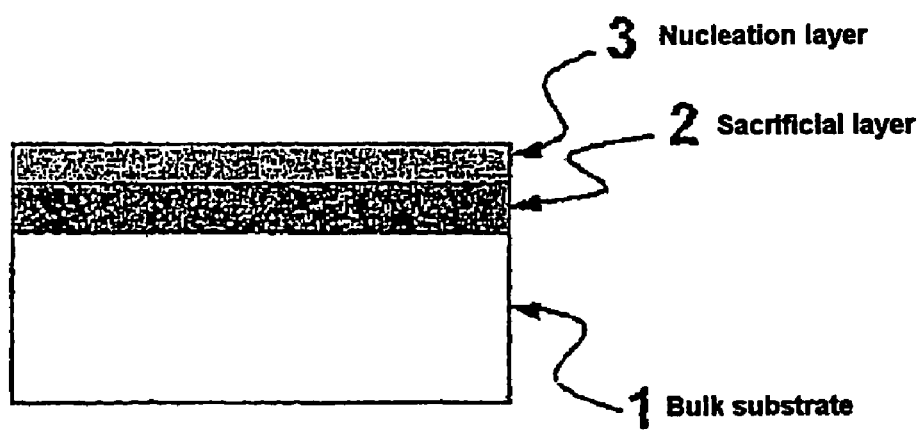
Figure 2B:
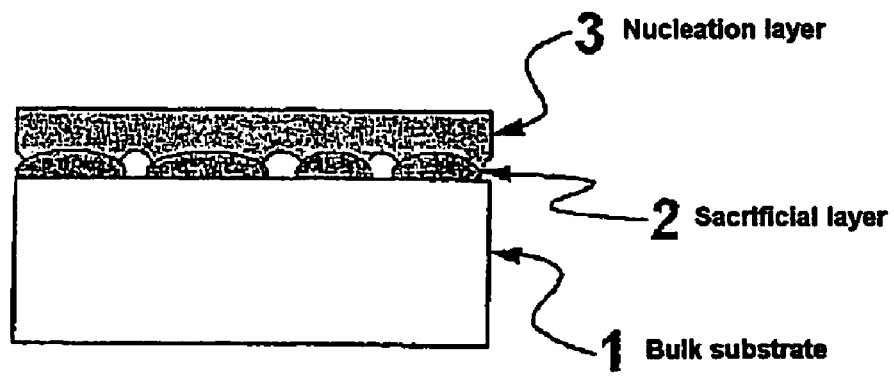
Figure 2C:
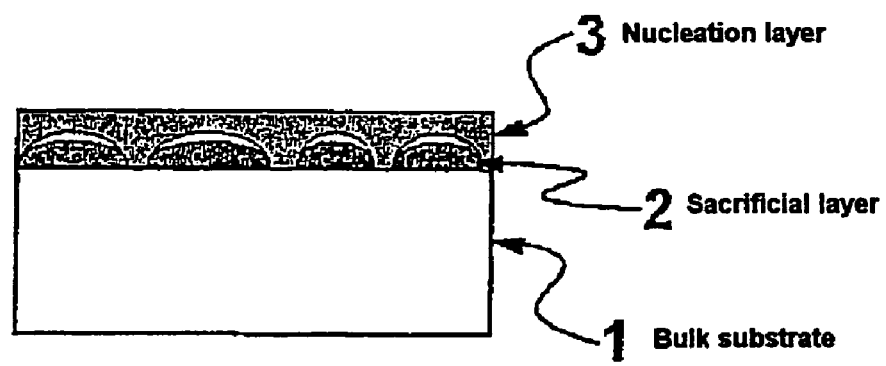
Figure 2D:
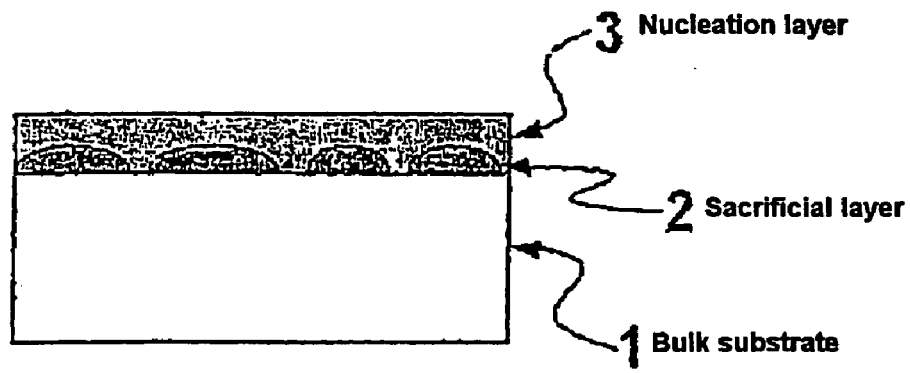
Figure 3:
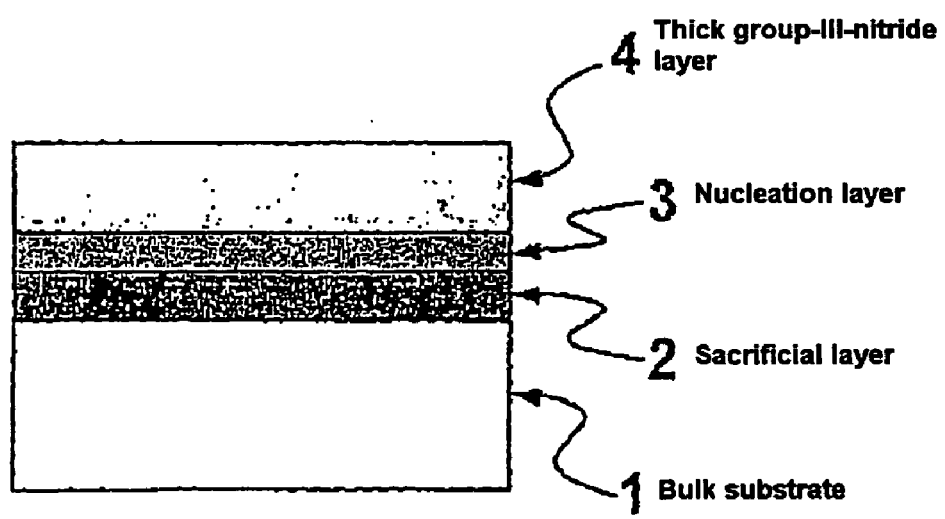
Figure 4:
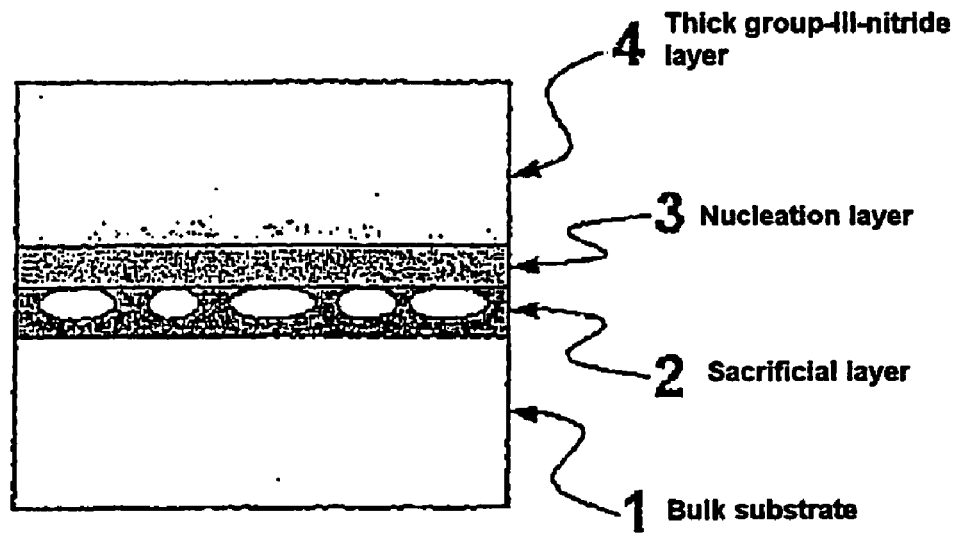
Figure 5:
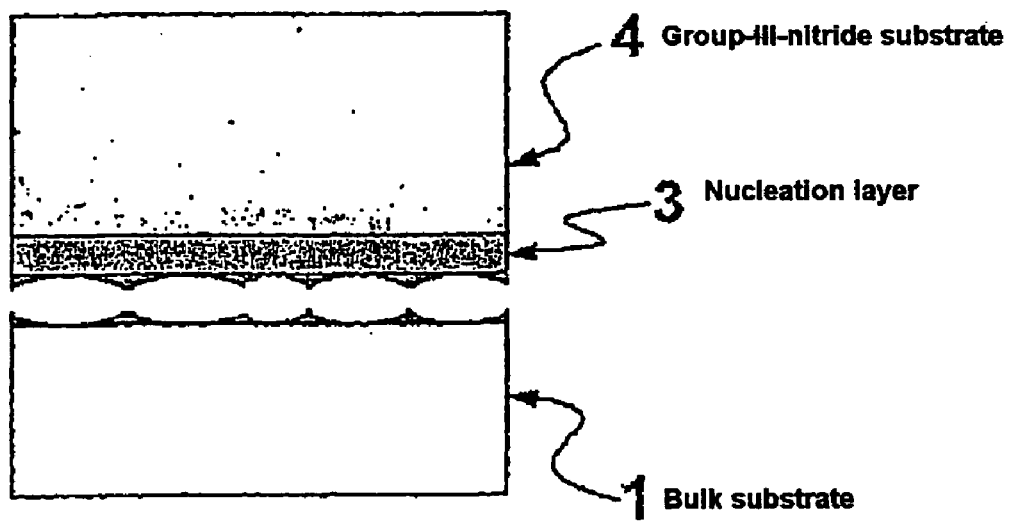
Figure 6:
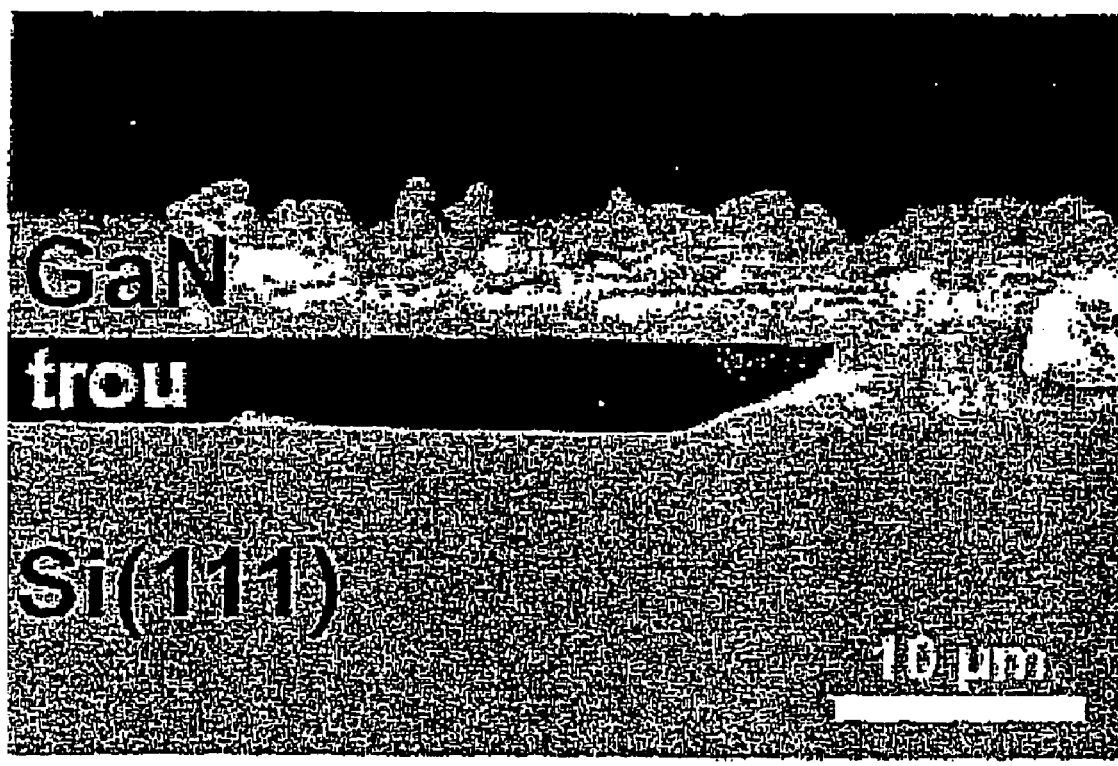

Other characteristics, aims and advantages of the invention will appear with the reading of the detailed description which will the follow from the specific embodiment of the invention in the case of obtaining a freestanding gallium nitride substrate in which the sacrificial layer is silicon, implementing the successive steps (i) to (iii) described above, in reference to the figures of which:

FIG. 1 is a representation of the starting substrate 1 provided with a silicon-based sacrificial layer 2 following a deposition step or a bonding (i), FIG. 2*a* is a representation of substrate 1 provided with a silicon-based sacrificial layer 2 entirely covering the substrate 1, on which a nucleation layer 3 is deposited, FIG. 2*b* is a representation of substrate 1 provided successively with a silicon-based sacrificial layer 2 not entirely covering substrate 1 and with a nucleation layer 3 which is grown epitaxially only on the discontinuous layer 2, FIG. 2*c* is a representation of substrate 1 provided successively with a silicon-based sacrificial layer 2 not entirely covering substrate 1 and with a nucleation layer 3 which is grown epitaxially only on the bulk substrate 1 from the areas not covered by the sacrificial layer 2, FIG. 2*d* is a representation of substrate 1 provided successively with a silicon-based sacrificial layer 2 not entirely covering substrate 1 and with a nucleation layer 3 which is grown epitaxially on the sacrificial layer 2 as well as on the areas not covered with substrate 1, FIG. 3 is a representation of substrate 1 provided successively with a silicon-based sacrificial layer 2, with a nucleation layer 3 and with a group-III-nitride layer 4, following the step (ii) and in the course of the step (iii), FIG. 4 is a representation of substrate 1 provided with the same layers as those represented in FIG. 3, in which the silicon layer 2 is in the process of vaporizing, FIG. 5 is a representation of the substrate at the end of the method, in which the sacrificial layer 2 is almost completely vaporized. This figure shows the result of the method: namely, on the one hand, a flat, thick, freestanding layer of wide surface (with possible residues of the sacrificial layer on the opposite face) and on the other hand the starting substrate 1, potentially covered with residues which can be recycled, FIG. 6 is an illustration of the surface vaporization phenomenon of a bulk silicon substrate during the growth of a layer of GaN by MOVPE on its surface, as described in example 1.

It should be noted that the diagrams are not to scale.

The preferred embodiments of the invention will be described hereafter. In particular, more detailed descriptions of layers 1, 2, 3 and 4 are taken up again and developed.

The bulk substrate 1 must allow the deposition of a single-crystal sacrificial layer. This implies that the bulk substrate 1 must be preferably single-crystal in the case where the sacrificial layer 2 is grown epitaxially on substrate 1. Thus, for example, the following single-crystal bulk substrates can be proposed: $Al_2O_3$, SiC, AlN, GaN.

The bulk substrate 1 is advantageously sapphire ($Al_2O_3$) or coefficients close to the group-III nitrides and they are chemically stable.

The optimal thickness of the bulk substrate 1 is that of a standard substrate: it lies between 150 μm and 1000 μm for a 2"-diameter substrate. In a preferential way it can lie between 300 μm and 500 μm.

The crystalline orientation of the bulk substrate 1 is preferably C(0001) or R(10-12), slightly disoriented (by a few degrees) or not. The orientations A(11-20) and M(1-100) can also be cited.

It is preferable that the intermediate layer 2 which serves as the sacrificial layer is a silicon layer. When the sacrificial layer 2 is of silicon, the epitaxy on sapphire (0001) yields a silicon crystal (111) whose surface presents a hexagonal atomic arrangement, adapted to the epitaxy of the group-III nitride oriented according to (0001).

It is preferable that the sacrificial layer 2 is a single-crystal with the best possible structural quality. Its crystalline structure must approach that of the bulk material by preference.

So as to facilitate the growth of a group-III-nitride substrate oriented in the crystallographic direction (0001), it is preferable to use a sacrificial layer 2 whose epitaxial face presents a hexagonal symmetry, such as, for example, a crystal oriented in the direction <111>. As a second choice, after the use of a sacrificial layer 2 oriented in the direction <111>, layers oriented in the directions <100> or <110> can be used. Indeed, it is possible, among other things, to epitaxy the group-III nitrides with a hexagonal structure on such sacrificial layers, in spite of the absence of hexagonal symmetry of the layer serving as a substrate.

A preferred variant of the invention consists of using a sacrificial layer 2 of silicon oriented in the direction <111> bound to a substrate 1, and not grown epitaxially. In this case, the substrate 1 does not need to be single-crystal, contrary to the sacrificial layer 2 which is preferably single-crystal. Thus, for example, the following single-crystal or polycrystalline bulk substrates 1 can be proposed: AlN, GaN, $Al_2O_3$, SiC, quartz.

The thickness of the intermediate sacrificial layer 2 lies preferably between 0.1 and 5 μm. The optimal thickness depends on the growth conditions used for the epitaxy of the future group-III-nitride substrate 4. The higher the growth temperature, the thicker the sacrificial layer must be to avoid a too-rapid separation of the growing layer 4 and of substrate 1. In the same way, it will be advantageous to increase the thickness of the sacrificial layer 2 for an elevated growth pressure.

It is preferable to use a nucleation layer 3, deposited on the sacrificial layer 2, to allow a better deposition of the thick layer of the group-III nitride 4 which will become the freestanding substrate.

It is preferable to use a layer of aluminum nitride (AlN) as the nucleation layer 3. The thickness of the nucleation layer 3 lies preferably between 10 and 50 nm.

The growth of the nucleation layer is achieved preferably by MOVPE at a growth rate in the range between 0.1 and 3 μm/h. The epitaxial temperature advantageously lies between 900° C. and 1100° C. and the pressure lower than $5 \times 10^4$ Pa so as not to evaporate the silicon layer 2 too quickly while preserving a high crystalline quality of the layers grown epitaxially.

While remaining within the scope of the invention, it is also possible to use molecular beam epitaxy (MBE) to deposit the nucleation layer 3. The steps carried out by MOVPE in the method can also be carried out by MBE, in which case the growth conditions are very different (typically very low pressure $P=10^{-4}$ to $10^{-7}$ Torr and low temperature T=700° C.).

If the sacrificial layer 2 is not continuous (organized or not), a variant of the invention consists of depositing the nucleation layer 3:
  exclusively on the sacrificial layer 2. In this case the nucleation layer is not continuous and a flat group-III-nitride layer is obtained in the last HVPE thickening step, or
  exclusively on the areas of substrate 1 not covered by the sacrificial layer. There is then no crystallographic relationship between the sacrificial layer 2 and the nucleation layer 3. In this case the epitaxial relationship between the substrate and the nucleation layer can be taken advantage of to increase the crystalline quality of the nucleation layer 3, without calling into question the separation of the group-III-nitride layer from the starting substrate 1 during the vaporization of the sacrificial layer 2, or
  on the entire surface of the sacrificial layer 2 and the bare areas of substrate 1.

It is preferable to improve as much as possible the crystalline quality of the layer serving as the substrate for the epitaxy of the thick layer of the group-III nitride 4 which will become the freestanding substrate. Thus it is preferable to deposit a group-III-nitride layer by low-speed MOVPE or MBE preceding the epitaxy of the thick layer of the group-III nitride 4. Moreover, it is preferable to use the growth techniques. known to those skilled in the art for the purpose of decreasing the densities of defects present in the nucleation layer. One can cite, for example, the ELO (epitaxial lateral overgrowth) technique, described in the review article "Epitaxial overgrowth of GaN," B. Beaumont, P. Vennéguès, P. Gibart, phys. stat. sol. (b) 227, No. 1, 1-43 (2001), the ELO without masking technique described in the article "Growth of high-quality GaN by low-pressure metal-organic vapor phase epitaxy (LP-MOVPE) from 3D islands and lateral overgrowth", H. Lahrèche, P. Vennéguès, B. Beaumont and P. Gibart, Journal of Crystal Growth 205, 245 (1999), or the technique for forming small islands of GaN, known as "spontaneous micro-ELO," described in MRS Internet J. Nitride Semicond. Res. 7, 8 (2002) making it possible to eliminate the step of the etching of a dielectric mask thanks to the spontaneous formation of patterns of GaN, in the form of islands, which play the same role.

These techniques are known for their capacity to reduce the density of extended defects dramatically, providing as a result a higher quality gallium nitride material. However, this step is not required (in particular because requiring an additional technological step can be expensive).

The preferred conditions used for the last step of the method for manufacturing a group-III-nitride substrate which relate to the deposition of a thick layer 4 of group-III nitride and its separation from the starting substrate by evaporation of the sacrificial layer are developed here.

When it is desired to manufacture thick layer of the group-III nitrides 4, the growth technique best adapted is hydride vapor-phase epitaxy (HVPE) because it allows growth rates capable of exceeding 100 μm/h (much higher than the average of 3 μm/h advisable in MOVPE) without loss of crystalline quality. In terms of crystalline quality, an epitaxy of GaN by HVPE from a starting layer of GaN grown epitaxially by MOVPE on sapphire (without any ELO step) leads to a layer that presents a dislocation density which decreases with the thickness h deposited according to a power law $h^{-2/3}$ (see article by S. K. Mathis, Jnl. Cryst. G. 231, 371 (2001) because of the crossing and annihilation of dislocations. Typically, a thick layer of 300 μm has an average dislocation density of $10^7$ $cm^{-2}$ and a thick layer of 1000 μm has an average dislocation density of $4 \times 10^6$ $cm^{-2}$. An ELO step allows a possible further reduction in dislocation density (by at least a factor of 10).

The partial or total vaporization of the sacrificial layer 2 is produced during the epitaxy of the thick layer 4 of group-III nitride which will next become the substrate. The optimal growth conditions for group-III nitrides by VPE are compatible with the spontaneous vaporization of silicon.

It is preferable not to evaporate the sacrificial layer 2 too quickly in order not to disturb the growth of the group-III nitride and not to separate the growing layer from the substrate too quickly in order not to break the group-III-nitride layer.

In particular, a temperature in the range between 900° C. and 1100° C. and a pressure in the range between $10^2$ Pa and $10^5$ Pa allow an optimal growth of the group-III-nitride layer 4 and a vaporization rate that is optimal for a sacrificial layer 2 of silicon.

In the case where the silicon-based sacrificial layer 2 is not entirely evaporated after the step of the epitaxy of the group-III nitride, allowing a residue of the sacrificial layer to remain on the group-III-nitride substrate, an additional step of the chemical etching of the silicon-based layer 2 can prove to be useful to entirely eliminate this silicon from the group-III-nitride substrate. The chemical etching can be accomplished according to techniques known in the state of the art. It is carried out preferably at low temperature when the material obtained is unloaded from the epitaxial reactor. The chemical solution depends on the type of intermediate layer: for silicon, the mixture $HNO_3$:HF or KOH is generally used.

The freestanding layers of GaN obtained according to the method of the invention are of great interest for the manufacture of electronic or optoelectronic components such as laser diodes, electroluminescent diodes, photodetectors, transistors, etc. This is true in particular by virtue of the specificity of the method which makes it possible to minimize considerably the material stresses usually created during the epitaxy and the cooling, and to minimize thereafter the curvature of the group-III-nitride substrate obtained, typically to attain a radius of curvature greater than 5 m. In particular the radius of curvature can be close to or can exceed 10 m.

Another advantage of the method according to the invention is that the starting substrate can be reused several times after the separation of the GaN layer, although a repolishing can prove to be necessary after each use.

The invention also has as an object a freestanding group-III-nitride substrate likely to be obtained according to the method of the invention, wherein its diameter is equal to or grater than 2" and wherein it has a radius of curvature greater than 5 m.

In an advantageous aspect, the freestanding group-III-nitride substrate likely to be obtained according to the method of the invention has a diameter equal to or greater than 2" and has a radius of curvature equal to or greater than 10 m.

The examples described below illustrate the invention.

EXAMPLE 1

Method by MOCVD/HVPE on Sapphire C

A freestanding gallium nitride substrate is produced according to the method of the invention. The starting substrate consists of a silicon layer of 2 µm oriented in the direction (111) grown epitaxially by CVD on a substrate of sapphire ($Al_2O_3$) oriented in the direction (0001) of 430 µm in thickness and of 2" in diameter. The ω/2θ-scan width at half-maximum by x-ray diffraction of the silicon layer is about 400 arcsec.

The first step of gallium nitride growth is carried out by MOVPE. The growth conditions are as follows:
Temperature T=1090° C.
Pressure P=$10^4$ Pa
Growth rate of the nucleation layer of AlN $R_{AlN}$=0.2 µm/h
Growth rate of the initial layer of GaN $R_{GaN}$=1.5-3 µm/h
V/III ratio for GaN=5000
Gas composition in the growth reactor $H_2:N_2$=1:1

The nucleation layer of AlN is deposited at a high temperature after an annealing/deoxidation of the silicon layer under $H_2:N_2$ flux for 5 min. The thickness of the layer of AlN is 30 nm.

The first layer of GaN is deposited on the nucleation layer at a low growth rate (1.5 µm/h). The thickness of this layer is approximately 1 nm. The ω/2θ-scan width at half-maximum by x-ray diffraction of the GaN layer is about 1000 arcsec. The crystalline quality increases with the thickness deposited (dislocations cross and are destroyed), but the silicon already begins to evaporate and/or to diffuse in the growing layer (it will probably diffuse less if T~1040° C.). FIG. 6 illustrates the vaporization of silicon in the practical case of the deposition by MOVPE of GaN/AlN on a bulk substrate of Si (111). The hole between the substrate and the layer of GaN is due to the evaporation of silicon during the epitaxy. In this case the rapid evaporation disturbs the growth of GaN. Such holes appear over the entire the surface of the substrate and not only starting from the edges of the substrate.

It is thus appropriate not to epitaxy too thick a layer by MOVPE so as not to consume all of the silicon before the final thickening step at a higher speed by HVPE.

The thickening of the GaN is carried out by HVPE by using the following growth conditions:
Temperature T=1000° C.
Pressure P=$2\times10^4$ Pa
Growth rate $R_{GaN}$=100 µm/h
Gas composition $H_2:N_2:NH_3$:HCl The thickness deposited by HVPE is 500 µm. The greater the thickness, the greater the crystalline quality of the material deposited, always via a process of progressive elimination of the dislocations which cross and are annihilated. The density of the typical dislocations measured is $5\times10^6$ cm$^{-2}$, which corresponds to the expected value following a thickening of 500 µm by HVPE. This density of dislocations is thus equivalent to that obtained for other freestanding GaN substrate manufacturing techniques (example: separation by laser lift-off).

The separation of the thick layer of GaN and the sapphire substrate is noted after HVPE growth on the entire surface (2"). Only a few traces of silicon remain on the back face of the freestanding nitride layer; these traces can be eliminated by chemical etching.

The ω/2θ-scan width at half-maximum by x-ray diffraction of the GaN layer obtained is less than 100 arcsec. The width at half-maximum of the excitonic lines ($D^0X$, A, C) observed by photoluminescence are lower than 1 meV.

EXAMPLE 2

Method by MBE/HVPE on Sapphire C

A freestanding gallium nitride substrate is produced according to the method of the invention. The starting substrate consists of a silicon layer of 5 µm oriented in the direction (111) grown epitaxially by CVD on a substrate. of sapphire ($Al_2O_3$) oriented in the direction (0001) of 430 µm in thickness and of 2" in diameter.

The first step of gallium nitride growth is carried out by MBE. The growth conditions are as follows:
Temperature T=800° C.
Pressure P=$10^{-5}$ Torr
Growth rate of the nucleation layer of AlN $R_{AlN}$=0.2 µm/h
Growth rate of the initial layer of GaN $R_{GaN}$=1 µm/h
V/III ratio for GaN=10

The nucleation layer of AlN is deposited at a high temperature after an annealing/deoxidation of the silicon layer under vacuum at high temperature (850° C.). The thickness of the layer of AlN is 30 nm.

The first layer of GaN is deposited on the nucleation layer at a low growth rate (1 µm/h). The thickness of this layer is approximately 500 nm. The crystalline quality increases with the thickness deposited (dislocations cross and are annihilated).

The thickening of the GaN is carried out by HVPE by using the following growth conditions:
Temperature T=950-1000° C.
Pressure P=$10^4$ Pa
Growth rate $R_{GaN}$=100 µm/h
Gas composition $H_2:N_2:NH_3$:HCl The thickness deposited by HVPE is 1000 μm. The greater the thickness, the greater the crystalline quality of the material deposited, always via a process of progressive elimination of the dislocations which cross and are annihilated.

The separation of the thick layer of GaN and the sapphire substrate is noted after HVPE growth on the entire surface (2"). Only a few traces of silicon remain on the back face of the freestanding nitride layer; these traces can be eliminated by chemical etching.

EXAMPLE 3

Method on Substrate SiC

A freestanding gallium nitride substrate is produced according to the method of the invention. The starting substrate consists of a silicon layer of 0.5 μm oriented in the direction (111) grown epitaxially by CVD on a 6H-SiC silicon carbide substrate oriented in the direction (0001) with a thickness of 280 μm and a diameter of 2".

The first step of gallium nitride growth is carried out by MOVPE. The growth conditions are as follows:
Temperature T=1090° C.
Pressure P=2×10$^4$ Pa
Growth rate of the nucleation layer of AlN $R_{AlN}$=0.1 μm/h
Growth rate of the initial layer of GaN $R_{GaN}$=1.5 μm/h
V/III ratio for GaN=2000
Gas composition in the growth reactor $H_2$:$N_2$=1:0

The nucleation layer of AlN is deposited at a high temperature after an annealing/deoxidation of the silicon layer under $H_2$ flux for 10 min. The thickness of the layer of AlN is 50 nm.

The first layer of GaN is deposited on the nucleation layer at a low growth rate (1.5 μm/h). The thickness of this layer is approximately 1 μm.

The thickening of the GaN is carried out by HVPE by using the following growth conditions:
Temperature T=950-1000° C.
Pressure P=10$^4$ Pa
Growth rate $R_{GaN}$=150 μm/h
Gas composition $H_2$:$N_2$:$NH_3$:HCl The thickness deposited by HVPE is 1000 μm. The separation of the thick layer of GaN and the sapphire substrate is noted after HVPE growth on the entire surface (2"). Only a few traces of silicon remain on the back face of the freestanding nitride layer; these traces can be eliminated by chemical etching.

EXAMPLE 4

Method on Substrate R-plane Sapphire

A freestanding gallium nitride substrate is produced according to the method of the invention. The starting substrate consists of a silicon layer of 2 μm oriented in the direction (100) grown epitaxially by CVD on a substrate of sapphire ($Al_2O_3$) oriented in the direction (10-12) of 430 μm in thickness and of 2" in diameter.

The first step of gallium nitride growth is carried out by MOVPE on an intermediate layer of AlN. The growth conditions are as follows:
Temperature T=1090° C.
Pressure P=10$^4$ Pa
Growth rate of the nucleation layer of AlN $R_{AlN}$=0.2 μm/h
Growth rate of the initial layer of GaN $R_{GaN}$=1.5 μm/h
V/III ratio for GaN=3000
Gas composition in the growth reactor $H_2$:$N_2$=1:1

The nucleation layer of AlN is deposited at a high temperature after an annealing/deoxidation of the silicon layer under $N_2$ flux for 5 min. The thickness of the layer of AlN is 100 nm.

The first layer of GaN is deposited on the nucleation layer at a low growth rate (1.5 μm/h). The thickness of this layer is approximately 200 nm. It can have a hexagonal or cubic crystalline structure according to the parameters of growth. In this example, the growth of hexagonal gallium nitride is favored.

The thickening of the GaN is carried out by HVPE by using the following growth conditions:
Temperature T=980° C.
Pressure P=10$^4$ Pa
Growth rate $R_{GaN}$=100 μm/h
Gas composition $H_2$:$N_2$:$NH_3$:HCl The thickness deposited by HVPE is 500 μm. The separation of the thick layer of GaN and the sapphire substrate is noted after HVPE growth on the entire surface (2"), only a few traces of silicon remain on the back face of the freestanding nitride layer; these traces can be eliminated by chemical etching.

EXAMPLE 5

Use of ELO (Bands) Starting from an AlN Layer

A freestanding gallium nitride substrate is produced according to the method of the invention. The starting substrate consists of the following stack: a silicon layer of 1 μm oriented in the direction (111) grown epitaxially by CVD on a layer of AlN of 50 nm on a layer of GaN of 2 μm on a substrate of sapphire ($Al_2O_3$) oriented in the direction (0001) of 430 μm in thickness and of 2" in diameter. The layer of AlN serves as a protective barrier between the layer of silicon and the layer of GaN which can react together and break down (diffusion of the silicon into the GaN).

A layer of $SiO_2$ of 200 nm which will serve as a mask is deposited on the silicon layer. The patterns formed of bands of several microns in width separated by several microns (typically 5 μm/5 μm) are revealed in the layer of $SiO_2$ by a step of standard photolithography and a chemical etching by BOE for 3 min. Then a chemical etching of the silicon layer by KOH at 80° C. for 10 min is used to etch the unmasked silicon layer up to the layer of AlN (with the same pattern as that defined by the photolithography).

A first step of gallium nitride regrowth is carried out by MOVPE to the openings of the silicon layer from the layer of AlN. The GaN is deposited to obtain a continuous and preferably flat layer before the growth by HVPE by using a well-known growth technique called ELO. The thickness of the GaN deposited is 2 μm. The growth conditions are as follows:
Temperature T=1120° C.
Pressure P=1×10$^3$ Pa
Growth rate of the initial layer of GaN $R_{GaN}$=2 μm/h
V/III ratio for GaN=5000
Gas composition in the growth reactor $H_2$:$N_2$=1:1

This ELO regrowth step makes possible a reduction in the density of dislocations of 1 to 2 orders of magnitude in the layer of GaN deposited in the first step.

The thickening of the GaN is carried out by HVPE by using the following growth conditions:
Temperature T=950-1000° C.
Pressure P=10$^4$ Pa
Growth rate $R_{GaN}$=100 μm/h
Gas composition $H_2$:$N_2$:$NH_3$:HCl The thickness deposited by HVPE is 500 μm. The separation of the thick layer of GaN and the sapphire substrate is noted after HVPE growth on the entire surface (2"). Only a few traces of silicon remain on the back face of the freestanding nitride layer; these traces can be eliminated by chemical etching.

The density of dislocations measured is less than $5 \times 10^6$ cm$^{-2}$ thanks to the use of the ELO technique.

EXAMPLE 6

Use of ELO (Holes) Starting from a GaN Layer

A freestanding gallium nitride substrate is produced according to the method of the invention. The starting substrate consists of the following stack: a silicon layer of 1 μm oriented in the direction (111) grown epitaxially by CVD on a layer of AlN of 50 nm deposited on a layer of GaN of 2 μm on a sapphire substrate (Al$_2$O$_3$) oriented in the direction (0001) of 430 μm in thickness and of 2" in diameter.

A layer of SiN of 20 nm which will serve as a mask is deposited on the silicon layer. The patterns formed of holes of several microns in diameter, separated by several microns (typically 5 μm/15 μm), are revealed in the layer of SiN by a step of standard photolithography and a plasma etching (RIE) using, for example, the gas Cl$_2$ or O$_2$. Then a chemical etching of the silicon layer by KOH at 80° C. for 10 min is used to etch the unmasked silicon layer up to the layer of AlN with the same pattern as that defined by the photolithography. Finally, the layer of AlN is etched up to the GaN layer by RIE (Cl$_2$ plasma).

A first step of gallium nitride regrowth is carried out by MOVPE to the openings of the silicon layer from the layer of GaN. The GaN is deposited to obtain a continuous and preferably flat layer before the growth by HVPE by using a well-known growth technique called ELO. The thickness of the GaN deposited is 2 μm. The growth conditions are as follows:

Temperature T=1090° C.
Pressure P=10$^4$ Pa
Growth rate of the initial layer of GaN R$_{GaN}$=3 μm/h
V/III ratio=5000
Gas composition in the growth reactor H$_2$:N$_2$=1:1

The thickening of the GaN is carried out by HVPE by using the following growth conditions:

Temperature T=950-1000° C.
Pressure P=10$^4$ Pa
Growth rate R$_{GaN}$=150 μm/h
Gas composition H$_2$:N$_2$:NH$_3$:HCl The thickness deposited by HVPE is 500 μm. The separation of the thick layer of GaN and the sapphire substrate is noted after HVPE growth. Only a few traces of silicon remain on the back face of the freestanding nitride layer; these traces can be eliminated by chemical etching.

EXAMPLE 7

Use of ELO Starting from Sapphire

A freestanding gallium nitride substrate is produced according to the method of the invention. The starting substrate consists of a layer of silicon of 1 μm grown epitaxially by CVD on a layer of sapphire (Al$_2$O$_3$) oriented in the direction (0001) of 430 μm in thickness and of 2" in diameter.

A layer of SiO$_2$ of 200 nm which will serve as a mask is deposited on the silicon layer. The patterns formed of bands of several microns in width separated by several microns (typically 5 μm/5 μm) are revealed in the layer of SiO$_2$ by a step of standard photolithography and a chemical etching by BOE for 3 min. Then a chemical etching of the silicon layer by KOH at 80° C. for 10 min is used to etch the silicon layer up to the layer of sapphire with the same pattern as that defined by the photolithography.

A first step of gallium nitride growth is carried out by MOVPE to the openings of the silicon layer from the sapphire substrate at low temperature (600° C.) to obtain a homogeneous deposition over the entire surface. The thickness of this layer of GaN is approximately 30 nm. Then an annealing is carried out at a standard growth temperature (1090° C.) for 10 min to transport the deposition of polycrystalline GaN which was deposited on the SiO$_2$ mask and to recrystallize it on the GaN deposited on the openings of the mask of SiO$_2$ and of silicon which is perfectly oriented with it in relation to the substrate. A deposition of GaN of 2 μm thickness follows the recrystallization step. The growth conditions are as follows:

Temperature T=1110° C.
Pressure P=2×10$^4$ Pa
Growth rate of the initial layer of GaN R$_{GaN}$=3 μm/h
V/III ratio for GaN=2000
Gas composition in the growth reactor H$_2$:N$_2$=1:1

The thickening of the GaN is carried out by HVPE by using the following growth conditions:

Temperature T=950-1000° C.
Pressure P=10$^4$ Pa
Growth rate R$_{GaN}$=100 μm/h
Gas composition H$_2$:N$_2$:HCl The thickness deposited by HVPE lies between 300 μm and 1000 μm. The separation of the thick layer of GaN and the sapphire substrate is noted after HVPE growth. Only a few traces of silicon remain on the back face of the freestanding nitride layer; these traces can be eliminated by chemical etching.

EXAMPLE 8

Use of ELO (Bands) and Substrate R-plane Sapphire

A freestanding gallium nitride substrate is produced according to the method of the invention. The starting substrate consists of the following stack: a silicon layer of 1 μm deposited on a layer of AlN of 50 nm deposited on a layer of GaN oriented in the direction A(11-20) of 2 μm on a substrate of sapphire (Al$_2$O$_3$) oriented in the direction R(10-12) of 430 μm in thickness and of 2" in diameter. The layer of AlN serves as a protective barrier between the layer of silicon and the layer of GaN which can react together and break down (diffusion of the silicon into the GaN).

A layer of SiO$_2$ of 200 nm which will serve as a mask is deposited on the silicon layer. The patterns formed of bands of several microns in width separated by several microns (typically 5 μm/5 μm) are revealed in the layer of SiO$_2$ by a step of standard photolithography and a chemical etching by BOE for 3 min. Then a chemical etching of the silicon layer by KOH at 80° C. for 10 min is used to etch the unmasked silicon layer up to the layer of AlN (with the same pattern as that defined by the photolithography).

A first step of gallium nitride regrowth is carried out by MOVPE to the openings of the silicon layer from the layer of AlN. The GaN is deposited to obtain a continuous layer before the growth by HVPE by using ELO growth. The thickness of the GaN deposited is 2 µm. The growth conditions are as follows:

Temperature T=1120° C.
Pressure P=2×10³ Pa
Growth rate of the initial layer of GaN $R_{GaN}$=2 µm/h
V/III ratio for GaN=5000
Gas composition in the reactor $H_2:N_2$=1:1

This ELO regrowth step makes possible a reduction in the density of dislocations and of extended defects of at least one order of magnitude in the layer of GaN.

The thickening of the GaN is carried out by HVPE by using the following growth conditions:

Temperature T=950-1000° C.
Pressure P=10⁴ Pa
Growth rate $R_{GaN}$=100 µm/h
Gas composition $H_2:N_2$:HCl The thickness deposited by HVPE is 800 µm. The separation of the thick layer of A-plane GaN and the R-plane sapphire substrate is noted after HVPE growth. Only a few traces of silicon remain on the back face of the freestanding nitride layer; these traces can be eliminated by chemical etching.

The invention claimed is:

1. A method for producing a freestanding group-III-nitride substrate from a starting substrate, by the deposition of a group-III nitride by epitaxy, which includes the use, on the aforementioned starting substrate, of a silicon-based intermediate layer as a sacrificial layer intended to be vaporized spontaneously during the later step of the epitaxy of the group-III nitride.

2. A method according to claim 1, wherein the group-III nitride is selected among AlN, $Al_xGa_{1-x}N$, $In_xGa_{1-x}N$ and $Al_xGa_yIn_{1-x-y}N$ (where $0 \leq x+y \leq 1$).

3. A method according to claim 2, wherein the group-III nitride is gallium nitride.

4. A method according to claim 1, wherein the silicon-based intermediate layer is of silicon, of silicon that includes impurities chosen among aluminum, indium, gallium, phosphorus and boron, or of SiGe.

5. A method according to claim 1, wherein the silicon-based intermediate layer is obtained by deposition or by bonding on the substrate.

6. A method according to claim 1, wherein the silicon-based intermediate layer is a single-crystal silicon layer oriented according to the direction <111>, <110> or <100>.

7. A method according to claim 6, wherein the single-crystal silicon layer is grown epitaxially according to the direction <111>.

8. A method according to claim 1, wherein the silicon-based intermediate layer is in continuous, discontinuous ordered or discontinuous disordered form.

9. A method according to claim 1, wherein the silicon-based intermediate layer has a thickness that lies in the range between 100 nm and 10 µm.

10. A method according to claim 1, wherein the group-III-nitride is formed having a thickness of greater than 50 µm.

11. A method according to claim 1, wherein the substrate is selected among sapphire, SiC, quartz, $MgAl_2O_4$, AlN and GaN or a combination thereof.

12. A method according to claim 1, wherein the substrate is sapphire.

13. A method according to claim 1, wherein the substrate is sapphire according to the C-plane (0001) or the R-plane (10-12) or the M-plane (1-100).

14. A method according to claim 1, wherein a nucleation layer chosen among AlN, SiC, low-temperature GaN, AlGaN, $Al_xGa_yIn_{1-x-y}N$ (where $0 \leq x+y \leq 1$), $Al_2O_3$, AlAs, GaAs or a combination of these various layers is deposited on the silicon-based sacrificial layer before the epitaxial growth of the group-III nitride.

15. A method according to claim 14, wherein an initial group-III-nitride layer is deposited on the nucleation layer before the growth of the bulk group-III nitride.

16. A method according to claim 15, wherein the thicknesses of the nucleation layer defined in claim 14 and that of the initial group-III-nitride layer defined in claim 15 lie between 0.01 and 0.5 µm, and 0.1 and 10 µm, respectively.

17. A method according to claim 16, wherein the growth rate of the nucleation layer defined in claim 14 and the initial group-III-nitride layer defined in claim 15 are about 0.01 to about 3 µm/h.

18. A method according to claim 1, which comprises the following successive steps:
(i) the deposition or the bonding on a substrate of a silicon-based sacrificial layer,
(ii) the deposition of a nucleation layer,
(iii) the deposition by epitaxy of a thick layer of the group-III-nitride on the bilayer (silicon-based intermediate layer/nucleation layer), under operating conditions compatible with a spontaneous vaporization of the silicon-based sacrificial layer.

19. A method according to claim 1, wherein the growth conditions of the thick layer of the group-III nitride are defined by the following parameters, taken separately or preferentially in combination:
the pressure lies in the range between $10^2$ and $10^5$ Pa,
the temperature lies in the range between 800° C. and 1200° C.,
the growth rate lies in the range between 10 and 200 µm/h.

20. A method according to claim 1, wherein the nucleation layer can be deposited, in the case when the sacrificial layer is not continuous, either exclusively on the sacrificial layer, or exclusively on the areas of the substrate not covered by the sacrificial layer, or over the entire surface of the sacrificial layer and the bare areas of the substrate.

21. A method according to claim 1, wherein the method includes an additional step of the elimination of the residues of the silicon-based intermediate layer that remain after the group-III-nitride layer growth step by chemical etching of this silicon-based intermediate layer.

22. A method according to claim 1, wherein part or all of the growth of the group-III-nitride layer is carried out by vapor phase epitaxy, HVPE or MOVPE, with MOVPE able to be substituted by MBE.

23. A method according to claim 1, wherein the group-III-nitride layer is deposited in two steps, a first step at a low growth rate according to a MOVPE or MBE technique, and a second step of the thickening of the layer by a HVPE technique.

24. A method according to the claim 23, wherein the group-III-nitride layer deposited in the first step defined in claim 23 is deposited at a speed that lies in the range between 0.1 and 5 µm/h.

25. A method according to claim 1, wherein the group-III nitride can be doped by a doping material able to be selected by the group consisting of magnesium, zinc, beryllium, calcium, carbon, boron, chromium, silicon and iron.

26. A freestanding substrate of group-III nitride obtained according to claim 1, wherein its diameter is equal to or greater than 2" and wherein it possesses a radius of curvature greater than 5 m.

27. A freestanding substrate of group-III nitride according to claim 26, wherein its diameter is equal to or greater than 2" and wherein it possesses a radius of curvature greater than or equal to 10 m.

* * * * *

UNITED STATES PATENT AND TRADEMARK OFFICE
CERTIFICATE OF CORRECTION

PATENT NO. : 7,282,381 B2
APPLICATION NO. : 10/573463
DATED : October 16, 2007
INVENTOR(S) : Eric Pascal Feltin, Zahia Bougrioua and Gilles Nataf It is certified that error appears in the above-identified patent and that said Letters Patent is hereby corrected as shown below:

Column 2, line 63 after "stable" delete --.--.
Column 8, line 1 after "techniques" delete --.--.
Column 16, line 27 delete --preferentially--.

Signed and Sealed this

Twenty-third Day of September, 2008

JON W. DUDAS
*Director of the United States Patent and Trademark Office*